United States Patent [19]

Oswald, Jr.

[11] 4,437,236

[45] Mar. 20, 1984

[54] SOLDER BONDING PROCESS

[75] Inventor: Joseph A. Oswald, Jr., Mechanicsburg, Pa.

[73] Assignee: E. I. Du Pont de Nemours and Company, Wilmington, Del.

[21] Appl. No.: 342,715

[22] Filed: Jan. 25, 1982

[51] Int. Cl.³ .......................................... H01R 43/02
[52] U.S. Cl. .................................. 29/879; 228/115; 228/205
[58] Field of Search ...................... 228/117, 205, 243; 29/879, 874, 882, 829, 885; 339/275 T, 275 B, 17 C; 174/52 FP; 134/1

[56] References Cited

U.S. PATENT DOCUMENTS

| | | | |
|---|---|---|---|
| 3,066,084 | 11/1962 | Osterman, Jr. et al. | 134/1 X |
| 3,444,610 | 5/1969 | Thomson | 29/470.1 |
| 3,451,836 | 6/1969 | Spooner et al. | 117/4 |
| 3,630,429 | 12/1971 | Matsuda et al. | 228/3 |
| 3,915,546 | 10/1975 | Cobaugh et al. | 339/17 C X |
| 3,919,760 | 11/1975 | Roders | 29/564.6 X |
| 4,001,464 | 1/1977 | Doutrich et al. | 427/58 |
| 4,167,424 | 9/1979 | Jubenville et al. | 134/1 |
| 4,183,611 | 1/1980 | Casciotti et al. | 29/879 X |

FOREIGN PATENT DOCUMENTS

| | | | |
|---|---|---|---|
| 1527442 | 7/1969 | Fed. Rep. of Germany | 228/205 |
| 2701852 | 7/1978 | Fed. Rep. of Germany | 228/117 |
| 718246 | 2/1980 | U.S.S.R. | 29/879 |

OTHER PUBLICATIONS

Electronic Design 4, Feb. 15, 1980, p. 25, by S. Ohr.
IBM Tech. Disclosure Bulletin, vol. 2, No. 2, Feb. 1960, p. 19.
Precision Metal Molding 21(1), Jan. 1963, p. 61.

Primary Examiner—Howard N. Goldberg
Assistant Examiner—Carl J. Arbes

[57] ABSTRACT

Process for locating solder on a precalculated position on an electrical terminal. Metal strip stock coated with a thin layer of solder is fed through a strip guide for precisely positioning the metal strip stock between a pair of rollers. A solder wire is cold bonded to the metal strip stock and the strip stock is subsequently stamped into a terminal.

8 Claims, 9 Drawing Figures

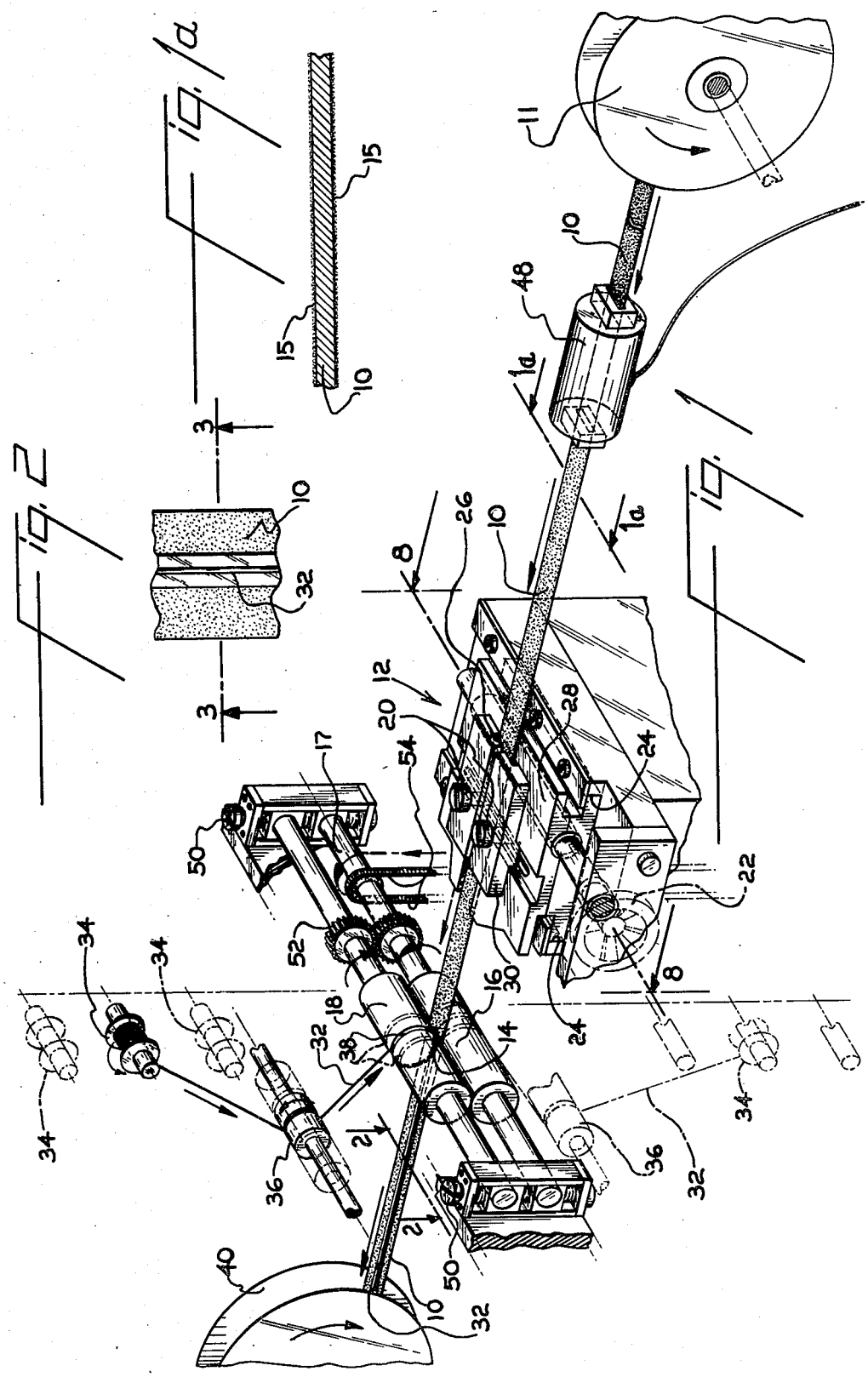

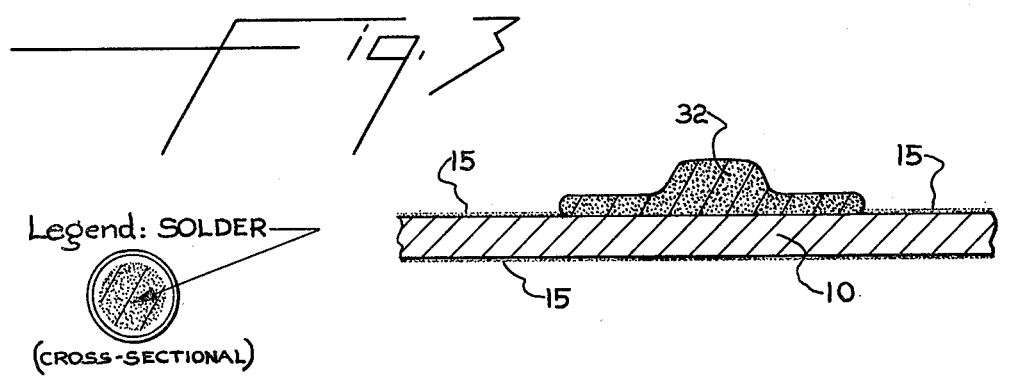
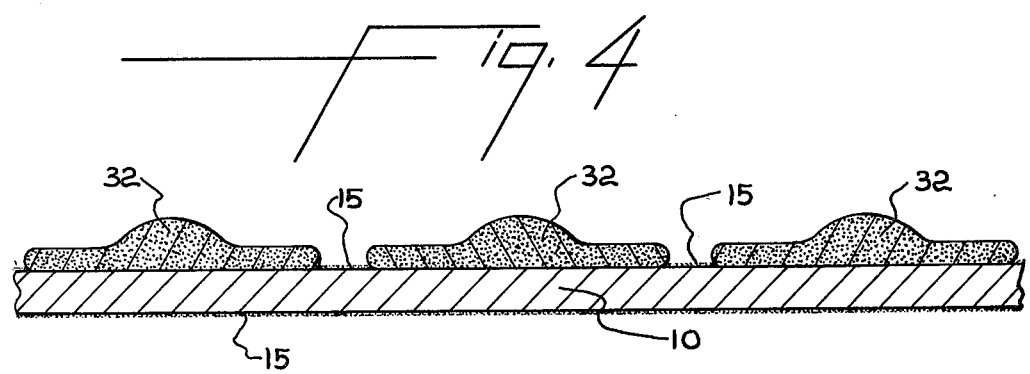
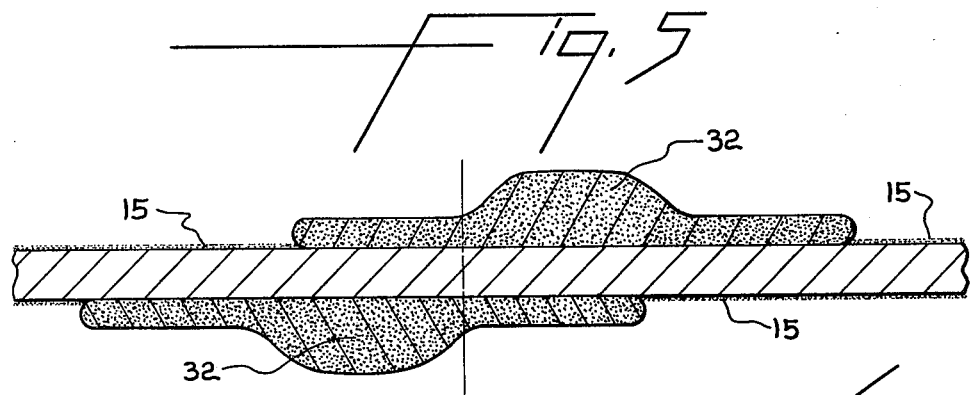
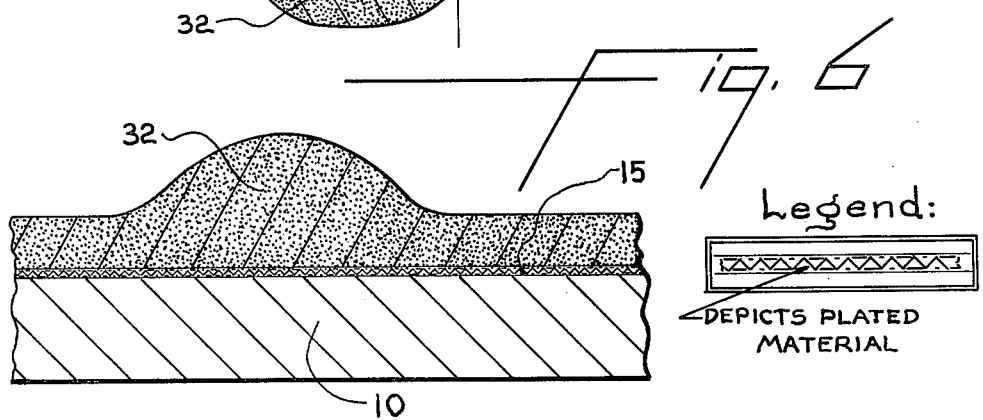

SOLDER BONDING PROCESS

DESCRIPTION

1. Technical Field

This invention relates to a process of bonding solder to metal substrates. More particularly, it refers to a process for locating solder in a predetermined position on a stamped electrical terminal.

2. Background Art

U.S. Pat. No. 3,451,836 describes a hot solder process for continuously bonding a solder stripe onto a wide metal strip material. Unfortunately, this process cannot be used at high speeds because of heat transfer limitations in the heating zone. Also, special controls are required to prevent excessive oxidation of the strip material and a separate cooling step is required. Further, the process requires the use of a flux.

Other methods for locating a plug of solder on a predetermined position of a terminal such as in U.S. Pat. Nos. 3,750,252 and 4,019,803, 4,120,558 depend upon bonding or mechanically attaching the solder plug on a finished terminal. This causes problems because of size and space limitations in not being able to locate the solder plug in the most favorable position adjacent to pad surfaces for eventual bonding to a circuit board or ceramic chip carrier.

Current commerical terminals containing solder plugs have the solder placed on the nonchip side of the terminal. In this situation the solder must migrate across the uncoated sheared edge of the terminal to form the required joint. To assure this migration excess solder is needed. With the trend to smaller and smaller terminals closely spaced together these solder plugs containing excess solder may create a shorting bridge from one contact pad to another.

SUMMARY OF THE INVENTION

I have solved the above problems by the discovery of a process for precisely locating controlled amounts of solder on a flat metal strip stock suitable for stamping and forming into an electrical terminal. The process involves precoating the metal strip stock with a thin layer of solder, feeding the solder coated metal strip stock into the nip of a pair of pressure rollers through a strip guide and rolling solder wire over a precalculated specific area of the metal strip stock as it is fed between the pressure rollers.

Thereafter, conventional methods of stamping and forming the metal strip stock results in a terminal having a thickened solder layer precisely located on the most desirable position of the terminal. After the terminal is inserted into a circuit board or ceramic chip, heating of the terminal above the melting point of the solder causes the solder to flow to the proper joint resulting in an excellent bond of the terminal to the board or chip. No excess solder is present to cause shorting between contact points.

BRIEF DESCRIPTION OF THE DRAWINGS

The present invention may be best understood by those of ordinary skill in the art by reference to the following detailed description when considered in conjunction with the accompanying drawings in which:

FIG. 1 is a perspective view of the solder bonding process.

FIG. 1a is a cross section of the solder plated metal strip stock.

FIG. 2 is a plan view of the metal stock with a layer of solder bonded thereto.

FIG. 3 is a cross section of the solder coated metal stock shown in FIG. 2 with a bonded layer of solder.

FIG. 4 is a cross section of a solder coated metal strip stock with three bonded layers of solder.

FIG. 5 is a cross section of a solder coated metal strip stock with a bonded layer of solder on each side.

FIG. 6 is an enlarged cross section of a solder coated metal strip stock as shown in FIG. 3 with one bonded layer of solder.

DESCRIPTION OF THE PREFERRED EMBODIMENT

Figure 7:
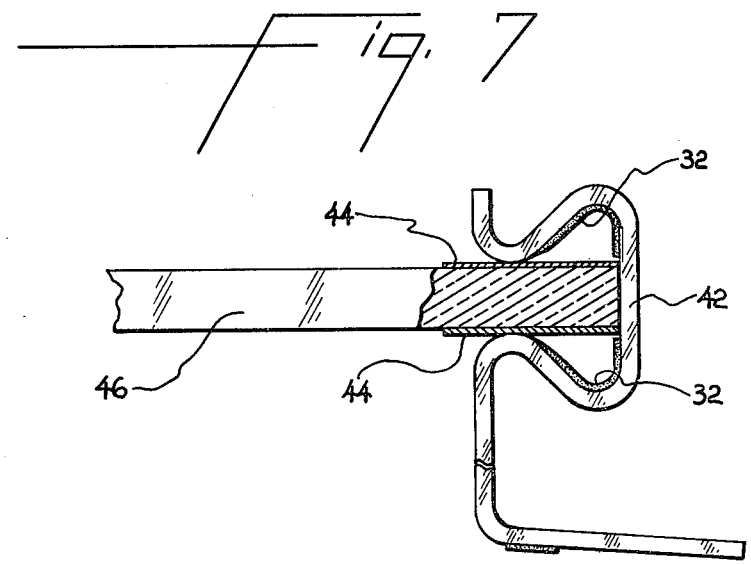
FIG. 7 is a perspective view of a stamped and formed chip carrier clip terminal with solder precisely located in an area most beneficial for permanent attachment of the terminal to the chip carrier contact pad.
Figure 8:
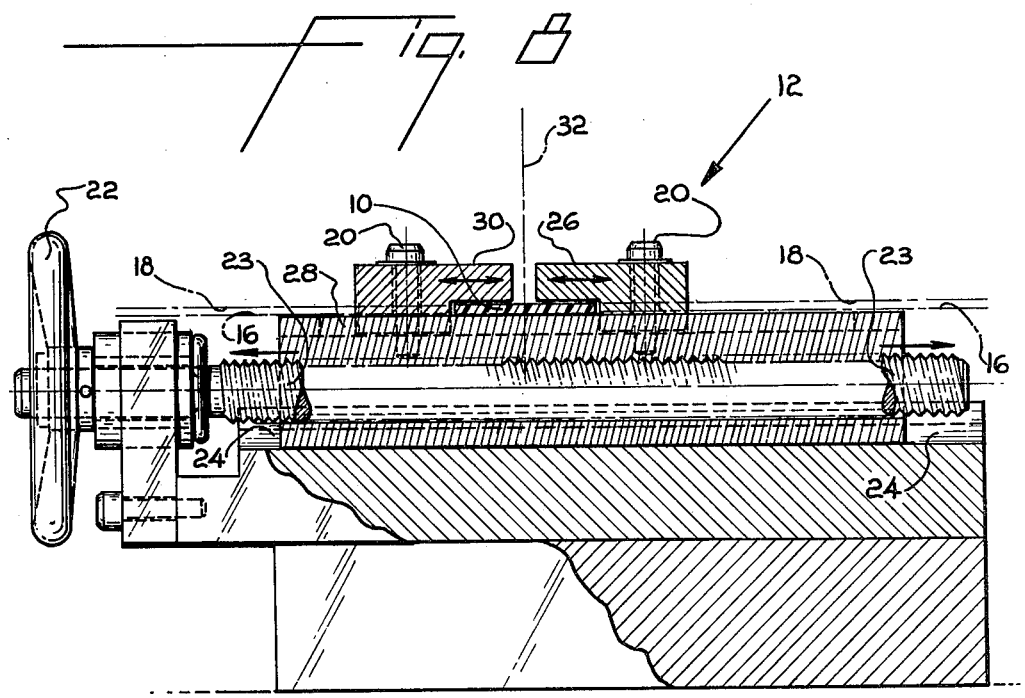
FIG. 8 is a cross section of the strip guide.

Referring to FIG. 1, a solder coated flat metal strip stock 10 which has been cleaned free of dirt and oil using an ultrasonic bath 48 containing an alkaline heavy duty phosphate spray wash such as INTEX 8679 available from Intex, Inc., is pulled through a strip guide 12. The strip stock is about 0.008-0.025 inches (0.20-0.64 mm) thick and is of a grade suitable for making electrical terminals. The strip stock can be made from phosphor bronze, brass, steel, copper, beryllium-copper or like conductive material capable of being solder plated. The solder coating should be between 50 and 500 microinches (0.0013-0.013 mm) thick. This thin layer enhances bonding of the thick layer of solder to the metal strip stock. This solder coating can be an alloy of tin-lead, gold or palladium. It is also possible to use a coating of substantially pure gold, palladium or tin.

The strip guide 12 controls the position of the strip 10 as it moves through the nip 14 of the rollers 16 and 18. The strip guide 12 consists of metal parts held together by bolts 20. It rides on rails 24 upon turning of a wheel 22 attached to a shaft containing a screw thread assembly 23. The strip stock is initially positioned between sections 26 and 30 and is supported by plate 28 which is movable by turning wheel 22. The exact position of the strip 10 within the strip guide 12 and with respect to the nip 14 of the rollers is closely controlled by movement of wheel 22.

As the metal strip 10 passes through the nip 14 between rollers 16 and 18 the solder wire 32 located in groove 38 of roller 18 is deposited on the metal strip 10. The source of solder wire 32 is a supply roll 34. The solder wire 32 is first drawn over roll 36 and then into groove 18. This is a cold bonding procedure permitting high speed operation of the entire line. The solder bonded wire (FIG. 2) is stored on reel 40 for subsequent use in making terminals.

Both the metal strip 10 and the solder wire 32 are drawn by rollers 16 and 18. A belt drive 54 causes shaft 17 to turn counterclockwise. Gear 52 is thereby actuated and causes roll 18 to turn in a clockwise direction. Tension on rollers 16 and 18 is controlled by adjustment screws 50. Rollers need to be set at a height which causes sufficient deformation in the solder to result in a final peel strength of 10 pounds per inch of solder width.

By varying the number of rollers 16 and 18, the number of grooves 38 in the rollers, the number of solder wire sources 34 and their position with respect to the metal strip 10 one can place multiple lines of solder on the strip 10 as shown in FIGS. 4 and 5. Accordingly, the bonded solder 32 can appear in different positions on the terminal 42.

FIG. 7 shows a typical clip terminal 42 with the bonded solder 32 located at the preferred position with respect to the pads 44 on the ceramic chip 46.

It is preferred to use rollers 16 and 18 having a two inch diameter (51 mm) and a width of approximately three inches (76.2 mm). The rollers should be hardened steel such as a Rockwell "C" 55–58. The nip 14 between the rollers should have a gap slightly larger than the thickness of the metal substrate. The rollers should be periodically cleaned with a felt faced wiper.

Operation of the described process can be approximately 150–600 feet per minute (45.7–183 M/min). It is preferable to run the process at approximately 300 feet per minute (91.5 M/min).

The solder thickness laid down on the strip is 600–2000 microinches (0.015–0.051 mm). The process is believed to be satisfactory when the peel strength of the bonded solder is at least ten pounds per inch of width of solder stripe on metal strip 10 (175 kg/M). The groove on the rollers should be approximately 0.002 inch (0.050 mm) in depth. If a control device is used between rollers 36 and 18 to locate the solder on roller 18, it is not necessary to employ grooves in roller 18.

The composition of the solder used to bond to the metal strip 10 can be tin-lead alloy, tin-silver alloy, lead-antimony alloy, tin-indium alloy or a combination of these alloys. The specific solder content depends upon desired melting-point and strength required in the terminal to chip solder bond. The preferred solder has a tin to lead ratio of 60 to 40.

The terminals produced by this process can be stamped and formed by conventional methods and produce the terminals such as shown in FIG. 7.

Having thus described the invention, what is claimed and desired to be secured by Letters Patent is:

1. Process for producing an electrical terminal from flat metal stock coated with a thin layer of solder, tin, gold, gold alloys, palladium or palladium alloys comprising
   a. feeding the coating metal stock into a nip of at least one pair of pressure rollers from a strip guide means, said strip guide means controlling the position of the metal stock between the rollers,
   b. cold rolling solder wire onto the metal stock at ambient temperature without the presence of a flux on the metal stock as it is fed between the pressure rollers, the nip between the rollers having a gap slightly larger than the thickness of the metal stock, and
   c. thereafter stamping and forming the metal stock to produce an electrical terminal with a thickened solder layer in a predetermined location on the terminal.

2. Process according to claim 1 wherein the flat metal stock is coated with a thin layer of solder containing tin and lead.

3. Process according to claim 2 wherein the tin to lead ratio in the solder is 60 to 40.

4. Process according to claims 1 or 2 wherein the coated metal stock is fed between the pressure rollers at a speed of 150–600 feet per minute (45.7–183 M/min).

5. Process according to claims 1 or 2 wherein the solder wire bonded to the metal stock is selected from the group consisting of tin-lead alloy, tin-silver alloy, lead-antimony alloy and tin-indium alloy.

6. Process according to claim 5 wherein the solder wire is a tin-lead alloy.

7. Process according to claims 1 or 2 wherein the coating on the metal stock is 50 to 500 microinches (0.0013–0.013 mm) thick and the solder bonded to the coated metal stock is 600 to 2000 microinches (0.0156–0.051 mm) thick.

8. Process according to claims 1 or 2 wherein the coated metal stock is cleaned in an ultrasonic bath just prior to entering the strip guide means.

* * * * *

UNITED STATES PATENT OFFICE
CERTIFICATE OF CORRECTION

PATENT NO. : 4,437,236

DATED : March 20, 1984

INVENTOR(S) : Joseph A. Oswald, Jr.

It is certified that error appears in the above-identified patent and that said Letters Patent are hereby corrected as shown below:

Column 4, line 5, "coating" should read -- coated --.

Signed and Sealed this

Twenty-sixth Day of June 1984

[SEAL]

Attest:

GERALD J. MOSSINGHOFF

Attesting Officer

Commissioner of Patents and Trademarks